(12) United States Patent
Piel et al.

(10) Patent No.: US 7,786,603 B2
(45) Date of Patent: Aug. 31, 2010

(54) ELECTRONIC ASSEMBLY HAVING GRADED WIRE BONDING

(75) Inventors: Pierre-Marie J. Piel, Tempe, AZ (US); Paul R. Hart, Tempe, AZ (US); Jeffrey K. Jones, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 197 days.

(21) Appl. No.: 11/262,057

(22) Filed: Oct. 28, 2005

(65) Prior Publication Data

US 2007/0096340 A1    May 3, 2007

(51) Int. Cl.
*H01L 23/48* (2006.01)
*H01L 23/34* (2006.01)

(52) U.S. Cl. .................. 257/784; 257/723; 257/728

(58) Field of Classification Search .............. 330/298; 257/678, 723, 728, 784, E23.024, E23.071, 257/E25.012, E25.014, E25.016, E25.029
See application file for complete search history.

(56) References Cited

U.S. PATENT DOCUMENTS

| | | | |
|---|---|---|---|
| 5,027,082 A * | 6/1991 | Wisherd et al. | 330/277 |
| 5,576,661 A * | 11/1996 | Kumagai | 330/277 |
| 6,331,931 B1 * | 12/2001 | Titizian et al. | 361/306.3 |
| 6,466,094 B2 | 10/2002 | Leighton et al. | |
| 6,930,381 B1 | 8/2005 | Cornelius | |
| 2004/0145034 A1 * | 7/2004 | Fujioka et al. | 257/664 |

OTHER PUBLICATIONS

International Search Report and Written Opinion of The International Searching Authority for PCT/US06/60253 dated Apr. 24, 2008.

* cited by examiner

*Primary Examiner*—Hung Vu
(74) *Attorney, Agent, or Firm*—Ingrassia, Fisher & Lorenz, P.C.

(57) ABSTRACT

According to one aspect of the present invention, an electronic assembly is provided. The electronic assembly comprises a substrate with a lead connected thereto and first and second microelectronic components on the substrate. The first microelectronic component has first and second portions. A plurality of conductors interconnects the first microelectronic component and a selected one of the lead and the second microelectronic component. A first of the conductors contacts the first portion of the first microelectronic component and has a first inductance, and a second of the conductors contacts the second portion of the microelectronic component and has a second inductance. The second inductance is greater than the first inductance.

20 Claims, 4 Drawing Sheets

ELECTRONIC ASSEMBLY HAVING GRADED WIRE BONDING

TECHNICAL FIELD

The present invention generally relates to an electronic assembly and a method for forming the same, and more particularly relates to an electronic assembly having graded wire bonding.

BACKGROUND

The use of Radio Frequency (RF) power transistor devices as signal amplifiers in wireless communication applications, and in computing systems in general, is well known. In recent years, the operating frequencies for such devices have increased dramatically and are now well into the gigahertz range. As the frequencies continue to increase, the specific design characteristics of the transistor devices become increasingly important.

A typical RF power amplifier includes a package, or package substrate, with one or more microelectronic dies, each having multiple transistors formed thereon, mounted on the package substrate, along with one or more shunt caps to modify the overall impedance of the power amplifier. Input and output leads are also connected to the package substrate, and wire bonds are typically used to make electrical connections between the various components.

As a RF signal passes through the RF power amplifier, different portions of the current associated with the signal travel different path lengths. For example, due to the "skin effect," as current leaves the RF power amplifier through the output lead, a majority of the current will be located near the outer edges of the lead. As a result, the current passes through the RF power amplifier unevenly. Additionally, an increased amount of current tends to flow through the ends of the transistor dies. This uneven current flow leads to some of the wire bonds overheating and being damaged.

Furthermore, different portions of the current flowing through the RF power amplifier will experience different impedances. These impedance mismatches hinder the performance of the amplifier.

Accordingly, it is desirable to provide a RF power amplifier with the capability to handle varying amounts of current across different portions thereof. In addition, it is desirable to provide a RF power amplifier with a specifically controlled (e.g., more constant) impedance across the different portions thereof. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. It should also be noted that FIGS. 1-7 are merely illustrative and may not be drawn to scale.

Figure 1:
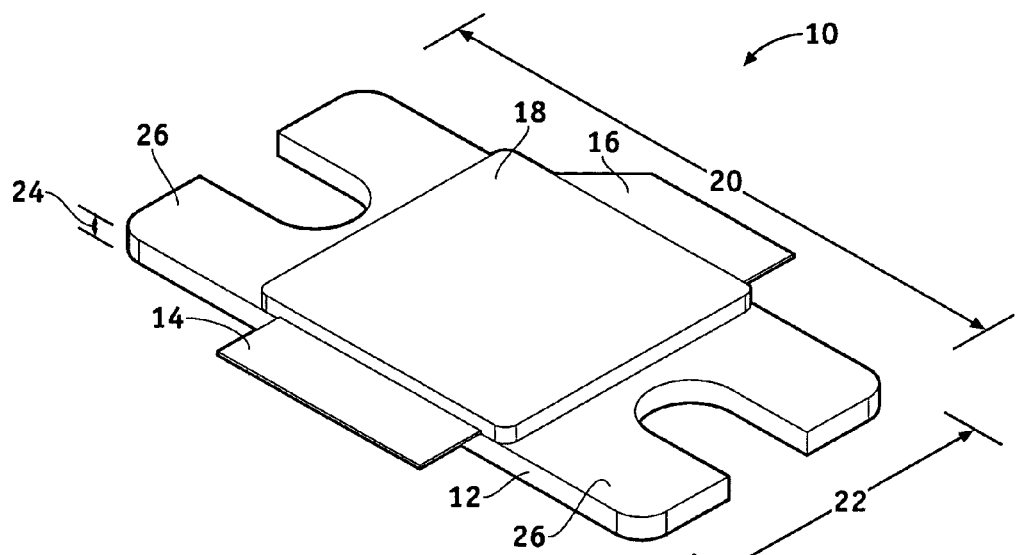
FIG. 1 is a perspective view of a RF power amplifier having a package substrate and a cover, according to one embodiment of the present invention.
Figure 2:
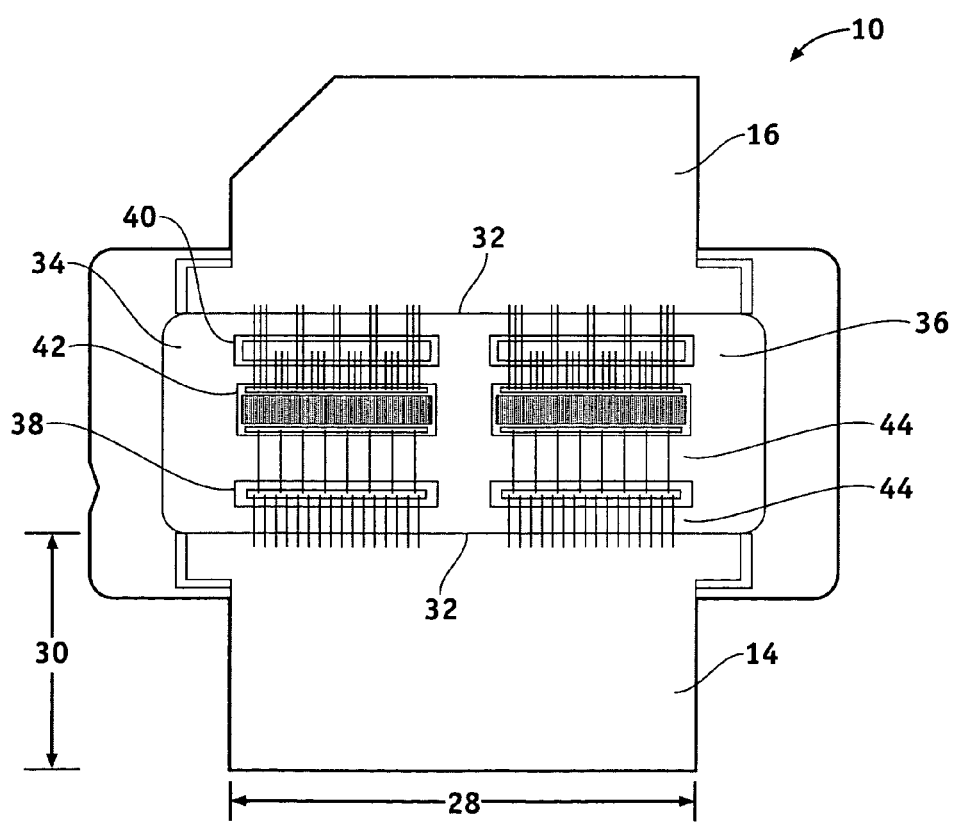
FIG. 2 is a top plan view of the RF power amplifier of FIG. 1 with the cover removed.

FIGS. 1 and 2 illustrate an electronic assembly (e.g., a Radio Frequency (RF) power amplifier 10), according to one embodiment of the present invention. The RF power amplifier 10 includes a package substrate 12, an input lead 14, an output lead 16, and a cover 18. The package substrate 12 is made of an electrically conductive material, such as aluminum or copper, and is substantially rectangular in shape. The package substrate 12 has, for example, a length 20 of approximately 20 mm, a width 22 of approximately 10 mm, and a thickness 24 of approximately 1 mm. The package substrate 12 also includes ground leads 26 at opposing ends thereof.

The input lead 14 (e.g., gate lead) and the output lead 16 (e.g., drain lead) are connected to opposing sides of the package substrate 12 and, although not specifically illustrated, electrically separated from the package substrate 12 by an insulating material, such as a plastic or ceramic compound. The input lead 14 and the output lead 16 may be made of the same material as the package substrate 12 and be substantially rectangular in shape with, for example, a length 28 of approximately 7 mm, a width 30 of approximately 4 mm, and a thickness of approximately 0.2 mm, as shown in FIG. 2. In the example illustrated, the output lead 16 includes an angled portion on a side opposing the package substrate 12. The input lead and the output lead may have inner edges 32 adjacent to the package substrate 12.

The cover 18 (e.g., lid) is substantially square in shape with a side length similar to the width 22 of the package substrate 12 and may be made of the same material as the package substrate 12. The cover 18 is connected to the package substrate 12 and covers a central portion of the package substrate 12 and the inner edges 32 of the input lead 14 and the output lead 16.

FIG. 2 illustrates the RF power amplifier 10 with the cover 18 removed from the package substrate 12. As shown, the RF power amplifier 10 also includes a first set of microelectronic components 34 and a second set of microelectronic components 36 on the central portion of the package substrate 12. In the example illustrated, each set of microelectronic components includes a first metal-oxide-silicon capacitor (MOSCAP) 38, a second MOSCAP 40, a transistor 42, and multiple conductors 44 interconnecting the other microelectronic components, the input lead 14, and the output lead 16.

It should be understood that although the following description may refer to only the microelectronic components in one of the sets of microelectronic components, the following description may also apply to both the first set of microelectronic components 34 and the second set of microelectronic components 36.

The first MOSCAP 38, the second MOSCAP 40, and the transistor 42, as shown in FIG. 2, are substantially rectangular in shape with, for example, lengths between 4 and 6 mm, widths between 0.2 and 1 mm, and thickness between 4 and 6 mils (1 mil=25.4 microns). The first MOSCAP 38, the second MOSCAP 40, and the transistor 42 are connected to the package substrate 12 and arranged in a row extending between the input lead 14 and the output lead 16 with the sides thereof extending substantially parallel to the inner edges 32 of the input lead 14 and the output lead 16.

Although not specifically illustrated, the first MOSCAP 38 and the second MOSCAP 40 may each include a semiconductor substrate with a layer of an oxide material formed thereon and a metallic layer formed over the oxide material, as is commonly understood in the art. The specific MOSCAPs, or shunt caps, used may vary depending on the particular electrical characteristics that are desired for the electronic assembly 10.

Figure 3:
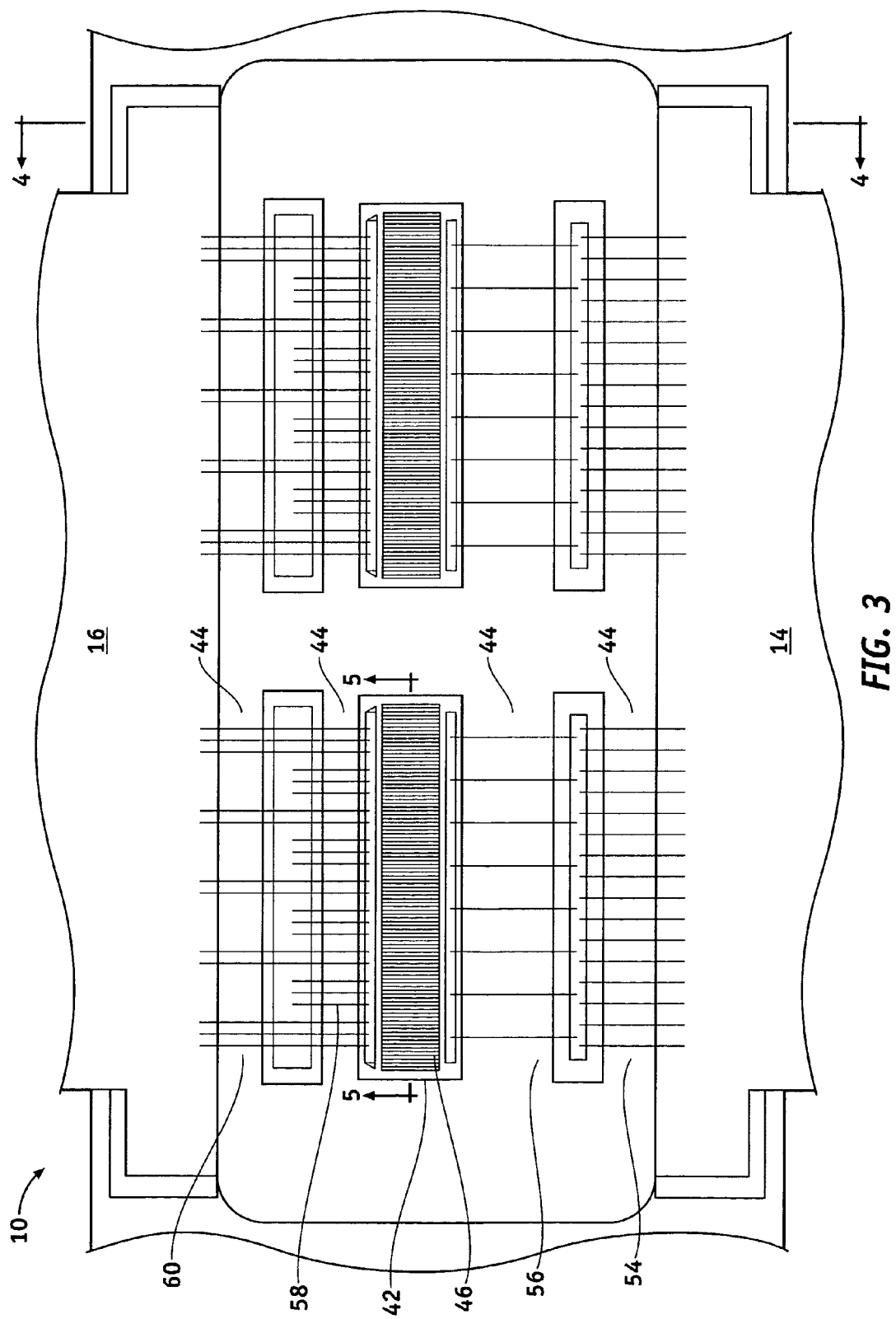
FIG. 3 is a top plan view of the package substrate.
Figure 6:
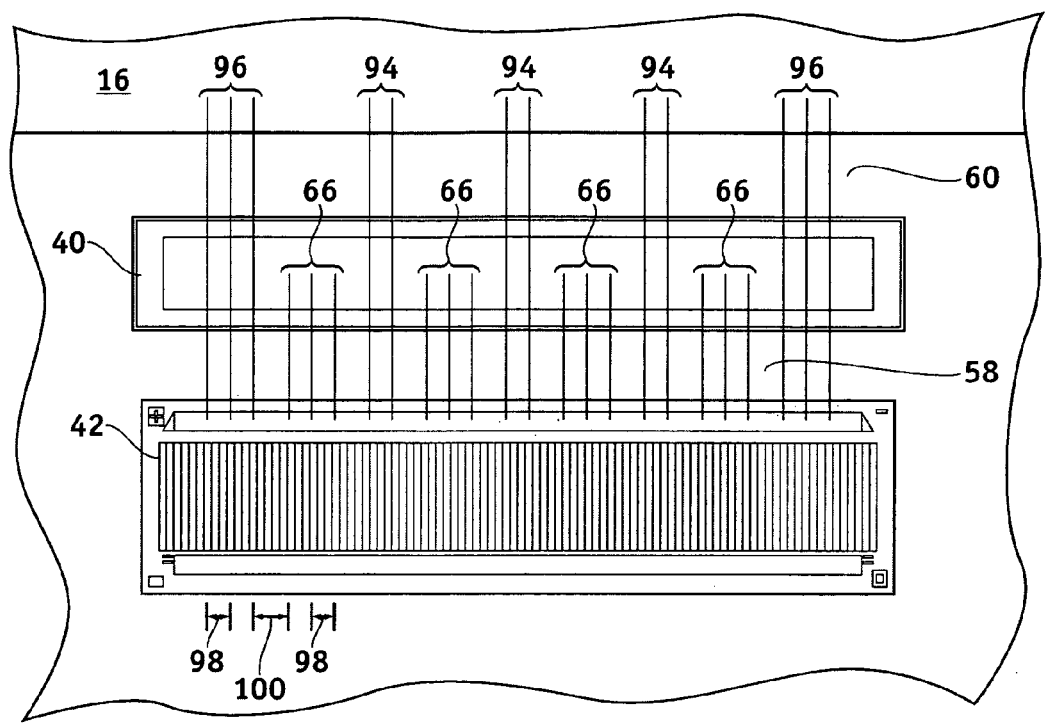
FIG. 6 is a top plan view of a transistor and a capacitor on the package substrate of FIG. 3.

Furthermore, the transistor 42 may include a semiconductor substrate, or microelectronic die, with multiple individual transistors formed thereon and arranged in "fingers" 46, as shown in FIG. 3, as will be appreciated by one skilled in the art. In the example illustrated, the fingers 46 are arranged to extend substantially perpendicularly to the sides of the transistor 42. Referring ahead to FIG. 6, the transistor 42 may also include a first portion 48, a second portion 50, and a third portion 52. The second portion 50 may lie substantially in the center of the transistor 42, and the first and third portions 48 and 52 may lie on opposing sides of the second portion 50 at respective ends of the transistor 42.

Figure 4:
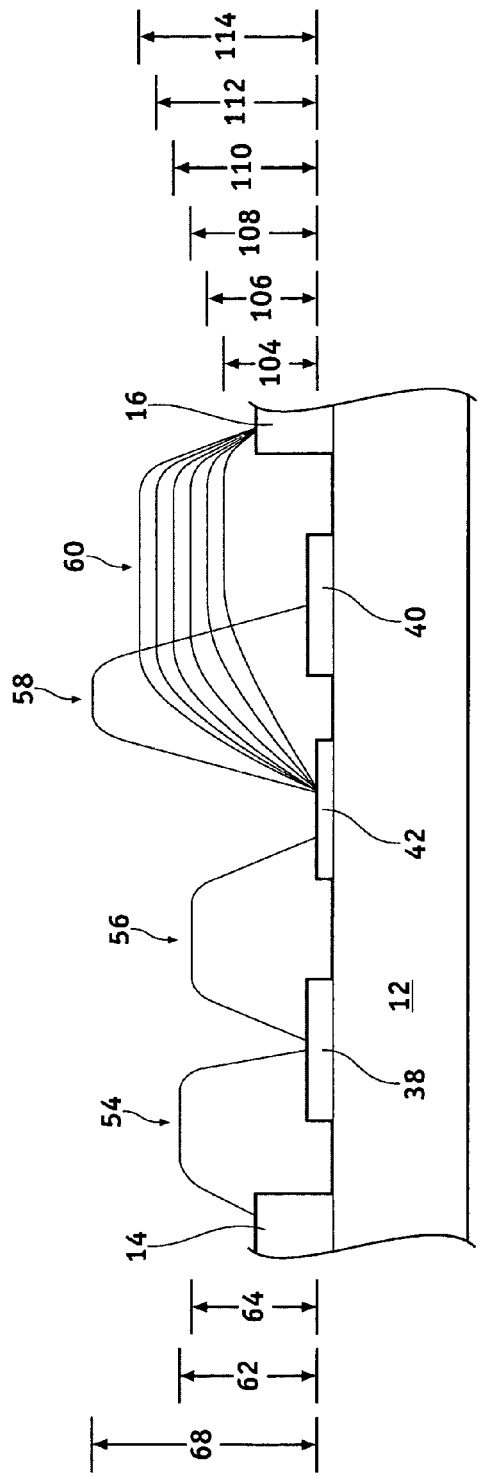
FIG. 4 is a cross-sectional side view of the package substrate shown in FIG. 3 and taken along line 4-4.

As illustrated in FIG. 3, in one embodiment, the conductors 44 (e.g., wires), include a first wire set 54, a second wire set 56, a third wire set 58, and a fourth wire set 60. The first wire set 54 interconnects the input lead 14 to the first MOSCAP 38. In the example shown, the first wire set 54 includes sixteen wires, having a length of approximately 75 mils. As illustrated in FIG. 4, each wire in the first wire set 54 has a loop height 62, as measured above an upper surface of the transistor 42, of approximately 28 mils. The first wire set 54 may be formed using a loop wire bonding process. Although not specifically illustrated, it should be understood that an upper surface of all of the microelectronic components, as well as the input and output leads, may include a plurality of contact pads to which the various wires 44 are connected. Furthermore, when viewed from a direction that is perpendicular to the package substrate 12, such as in FIG. 3, all of the conductors 44 extend between the various components of the RF power amplifier 10 substantially parallel to one another.

As shown in FIGS. 3 and 4, the second wire set 56 interconnects the first MOSCAP 38 and the transistor 42. In the illustrated embodiment, the second wire set 56 includes eight wires, each of which is connected to the first MOSCAP 38 between a respective pair of wires from the first wire set 54 and has a length of, for example, 70 mils. Each wire in the second wire set 56 has, for example, a loop height 64 of approximately 21 mils. The second wire set 56 may also be formed using a loop wire bonding process.

Figure 5:
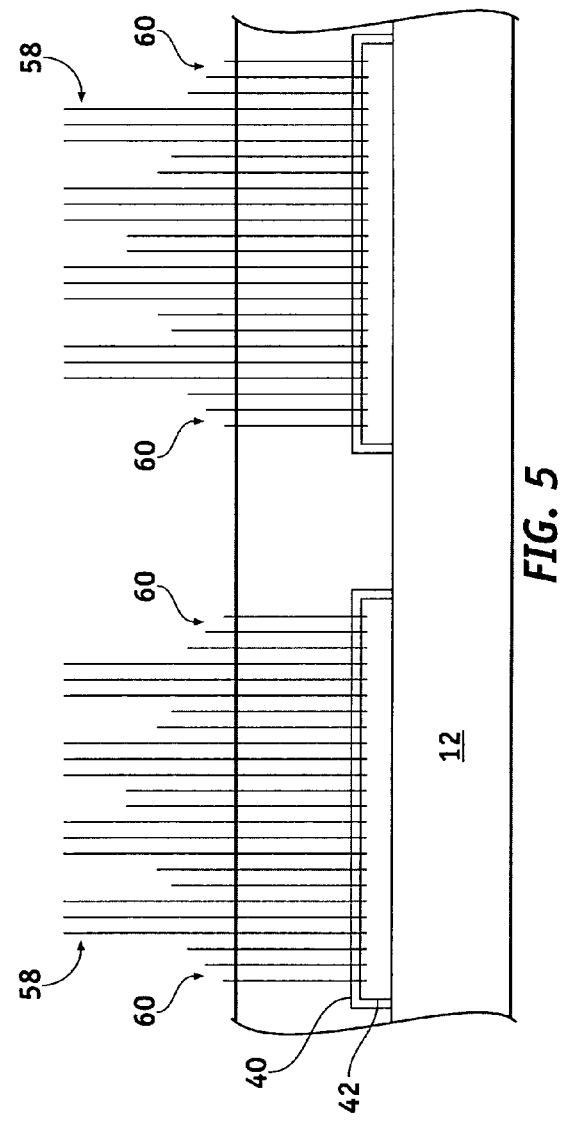
FIG. 5 is a cross-sectional side view of the package substrate shown in FIG. 3 and taken along line 5-5.

Referring now to FIGS. 5 and 6 in combination with FIG. 4, the third wire set 58 interconnects the transistor 42 and the second MOSCAP 40. As shown, the third wire set 58 includes twelve wires arranged in four three-wire groups 66. In an exemplary embodiment, each of the wires in the third wire set 58 has a length of approximately 48 mils and a loop height 68 of approximately 40 mils, as shown specifically in FIG. 4.

Figure 7:
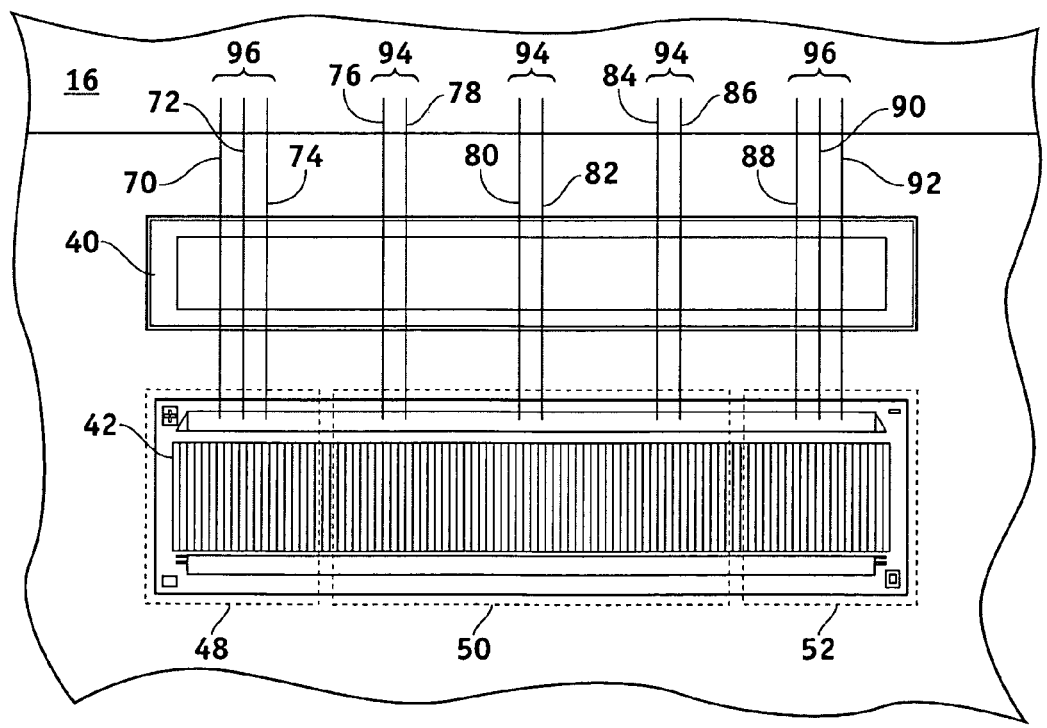
FIG. 7 is a top plan view of the transistor and the capacitor similar to that shown in FIG. 6.

The fourth wire set 60 interconnects the transistor 42 and the output lead 16. The fourth wire set 60 includes twelve wires 70-92 arranged in five groups including three two-wire groups 94 and two three-wire groups 96, as shown in FIGS. 6 and 7. The three-wire groups 96 from the fourth wire set 60 contact the opposing ends of the transistor 42 with the groups from the third wire set 58 and the remaining groups of wires in the fourth wire set 60 alternating between. As shown, the groups of wires are arranged such that none of the wires from either the third wire set 58 or the fourth wire set 60 lies immediately between two wires from the other set of wires. Although not specifically illustrated, it should be understood that each wire within the second, third, and fourth wire sets 56, 58, and 60, respectively, may be electrically connected to particular fingers 46, or groups of fingers 46, within the transistor 42.

Still referring to FIG. 6, the wires in each group of the third wire set 58 are separated by a distance 98 of approximately 7 mils, as are the wires in each group of the fourth wire set 60. The groups of the third wire set 58 are separated from the groups of the fourth wire set 60 by a distance 100 of approximately 8 mils.

FIG. 7 illustrates the transistor 42 and the output lead 16 similarly to FIG. 6. However, for clarity, the third wire set 58 is not shown in FIG. 7. As shown, the three-wire groups 96 in the fourth wire set 60 contact the transistor 42 on the first and third portions 48 and 52, and the two-wire groups 94 contact the transistor 42 on the second portion 50. Therefore, because of the separation between the wires within each group of wires (e.g., 7 mils), a higher wire density of the wires 44 in the fourth wire set 60 exists on the first and third portions 48 and 52 of the transistor 42 than on the second portion 50 of the transistor 42 for a particular length 102 of the transistor 42. For example, in the three-wire group 96 that contacts the first portion 48 of the transistor 42, three wires contact the transistor 42 within a space of approximately 14 mils. Therefore, a wire density of approximately 0.21 wires per linear mil exists on the first portion 48. However, for any 14 mil length portion of the transistor 42 on the second portion 50 of the transistor 42, the highest number of wires in the fourth wire set 60 is two. Therefore, the highest wire density for a 14 mil length portion on the second portion 50 of the transistor 42 is approximately 0.14 wires per linear mil.

Referring to FIG. 7 in combination with FIGS. 4 and 5, in the exemplary embodiment shown, wires 70 and 92 are connected at the outer most portions of the fourth wire set 60 near the ends of the transistor 42. Wires 72 and 90 lie adjacent to wires 70 and 92, respectively, closer to the center of the transistor 42. Wires 74 and 88 are located immediately to the inside of the transistor 42 adjacent to wires 72 and 90, respectively, and so forth. Therefore, wires 80 and 82 lie immediately next to one another and are located at the center of the fourth wire set 60. As shown in FIGS. 4 and 5, wires 70 and 92 have a loop height 104 of approximately 23 mils. Wires 72 and 90 have a loop height 106 of approximately 26 mils. Wires 74 and 88 have a loop height 108 of approximately 28 while wires 76 and 86 have a loop height 110 of approximately 30 mils. Wires 78 and 84 have a loop height 112 of approximately 32 mils, and wires 80 and 82 have a loop height 114 of approximately 34 mils.

Therefore, as illustrated specifically in FIG. 5, as the wires 70-92 of the fourth wire set 60 are positioned nearer to the center of the transistor 42, the loop heights, and thus the lengths, of the wires increase. As a result, the wires within the groups of the fourth wire set 60 that contact the first and third portions 48 and 52 of the transistor 42 have higher average loop heights than those that contact the second portion 50. The varying wire density of the fourth wire set 60 illustrated in FIG. 7 and the varying loop heights of the wires of the fourth wire set 60 illustrated in FIGS. 4 and 5 create a "graded" wire bond scheme between the transistor 42 and the output lead 16.

In use, the RF power amplifier 10 is installed in an electrical, or computing, system, and, referring to FIG. 2, a RF signal is sent into the RF power amplifier 10 through the input lead 14. The RF signal may have a frequency, for example, of between 400 megahertz and 6 gigahertz. The signal passes through the first wire set 54, into and out of the first MOSCAP 38, and into the transistor 42 through the second wire set 56. As is commonly understood in the art, as the signal passes through the transistor 42, each pulse of the signal activates the gates of the individual transistors on the transistor 42 which allows an amplified pulse to be sent through the ground leads 26, into and out of the transistor 42, through the fourth wire set 60 and into the output lead 16.

Still referring to FIG. 2, as previously mentioned, as the signal passes through the input lead 14, through the RF power amplifier 10, and out of the output lead 16, the current is not evenly distributed across the leads 14 and 16 and the transistors 42. In particular, an increased amount of current flows through the sides and center portions of the leads 14 and 16, and the corresponding ends, or first and third portions 48 and 52, of each of the transistors 42, as shown in FIG. 7. Because of the increased wire density of the fourth wire set 60 at the ends of the transistors 42, the overall resistance experienced by the current flowing through the first and third portions 48 and 52 of the transistors 42 is decreased.

Additionally, because of the varying lengths, and heights, of the individual wires of the fourth wire set 60, shown in FIGS. 4 and 5, the inductance of each wire differs, and as a result, the current flowing through the various portions of the RF power amplifier 10 will experience relatively similar impedances.

One advantage of the electronic assembly described above is that because of the wire density distribution the operating temperatures of the wires between the microelectronic components are reduced. Therefore, the amount of current that passes through the assembly may be increased without damaging the wires. Another advantage is that because of the varying inductances of the wires between the microelectronic components the impedance across the various portions of the assembly is made more constant. Therefore, the performance of the assembly is improved.

Other embodiments of the electronic assembly may utilize different numbers and types of microelectronic components. The wires used may have loop heights, and thus lengths, different from those described above in the exemplary embodiments. The graded wire scheme described above may be used between other components of the electronic assembly besides the transistor and the output lead. For instance, the graded wire scheme may be also be used to interconnect the first MOSCAP to the transistor. Furthermore, the impedance across the transistor, or the other components of the assembly, may not be constant, as the graded wire scheme may be used to create specific impedance gradients across the different portions of the assembly.

The invention provides an electronic assembly. The electronic assembly may include a substrate, a lead connected to the substrate, a first microelectronic component having first and second portions on the substrate, a second microelectronic component on the substrate, and a plurality of conductors interconnecting the first microelectronic component and the lead or the second microelectronic component, a first of the conductors contacting the first portion of the first microelectronic component and having a first inductance and a second of the conductors contacting the second portion of the microelectronic component and having a second inductance, the second inductance being greater than the first inductance.

A first of the conductors may have a first length, and the second of the conductors may have a second length which is greater than the first length. The first of the conductors may extend to a first height above the substrate, and the second of the conductors may extend to a second height above the substrate which is greater than the first height.

The conductors may be wires. The plurality of conductors may include a first group of conductors and a second group of conductors. The first group of conductors may contact the first portion of the microelectronic component with a first wire density, and the second group of the conductors may contact the second portion of the microelectronic component with a second wire density. The first wire density may be higher than the second wire density.

The first microelectronic component may also include a third portion. The first portion and the third portion may be on opposing sides of the second portion.

The plurality of conductors may also include a third group contacting the third portion of the microelectronic component with a third wire density. The third wire density may be higher than the second wire density.

The invention also provides a RF power amplifier. The RF power amplifier may include a substrate, a lead connected to the substrate, a first microelectronic component having first, second, and third portions on the substrate, the first and third portions being on opposing sides of the second portion, a second microelectronic component on the substrate, and a plurality of conductors interconnecting the first microelectronic component and the lead or the second microelectronic component, a greater number of the conductors contacting the first and third portions of the first microelectronic component per unit length of the first microelectronic component than the second portion of the microelectronic component.

The plurality of conductors may interconnect the first microelectronic component and the lead. The RF power amplifier may also include a second plurality of conductors interconnecting the first microelectronic component and the second microelectronic component. At least one of the conductors may contact at least one of the first and third portions of the first microelectronic component and have a first inductance, and at least one of the conductors may contact the second portion of the first microelectronic component and have a second inductance. The second inductance may be greater than the first inductance.

The at least one conductor contacting the at least one of the first and third portions of the first microelectronic component may have a first length, and the at least one conductor contacting the second portion of the first microelectronic component may have a second length. The second length may be greater than the first length. The at least one conductor contacting the at least one of the first and third portions of the first microelectronic component may extend to a first height above the substrate, and the at least one conductor contacting the second portion of the first microelectronic component may extend to a second height above the substrate. The second height may be greater than the first height.

The conductors may be wires and, when viewed from a direction that is substantially perpendicular to the substrate, the plurality of wires may extend from the first microelectronic component substantially parallel to one another. The first microelectronic component may be a microelectronic die having a plurality of transistors formed thereon.

The invention further provides a RF power amplifier. The RF power amplifier may include a package substrate, a lead connected to the package substrate, a microelectronic die on the package substrate, the microelectronic die having first, second, and third transistors formed on respective first, second, and third portions thereof, the first and third portions being on opposing sides of the second portion, a microelectronic component on the substrate, and a first plurality of conductors interconnecting the first portion of the microelectronic die and a selected one of the lead or the microelectronic component, a first number of the first plurality of conductors contacting the first portion of the microelectronic die per unit length of the microelectronic die and the first plurality of conductors having a first average length, a second plurality of conductors interconnecting the second portion of the microelectronic die and the selected one of the lead or the microelectronic component, a second number of the second plurality of conductors contacting the second portion of the microelectronic die per unit length of the microelectronic die and the second plurality of conductors having a second average length, and a third plurality of conductors interconnecting the third portion of the microelectronic die and the selected one of the lead or the microelectronic component, a third number of the third plurality of conductors contacting the third portion of the microelectronic die per unit length of the microelectronic die and the third plurality of conductors having a third average length, wherein the first number of the first plurality of conductors contacting the first portion of the microelectronic die per unit length of the microelectronic die and the second number of the second plurality of conductors contacting the second portion of the microelectronic die per unit length of the microelectronic die are greater than the third number of the third plurality of conductors contacting the third portion of the microelectronic die per unit length of the microelectronic die, and the first and third average lengths are less than the second average length.

The first plurality of conductors may extend to a first average height above the microelectronic die, the second plurality of conductors may extend to a second average height above the microelectronic die, and the third plurality of conductors extend to a third average height above the die. The second average height may be greater than the first and third average heights. The first plurality of conductors, the second plurality of conductors, and third plurality of conductors may be wires.

The RF power amplifier may also include a second lead connected to the package substrate, a second microelectronic component on the package substrate, and a fourth plurality of wires interconnecting the microelectronic die, the second microelectronic component, and the second lead. The microelectronic component and the second microelectronic component may be metal-oxide-silicon capacitors.

The microelectronic die, the microelectronic component, the second microelectronic component, the first plurality of wires, the second plurality of wires, the third plurality of wires, and the fourth plurality of wires may jointly form a first set of microelectronic components. The RF power amplifier may also include a second set of microelectronic components substantially identical to the first microelectronic components.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An electronic assembly, comprising:
   a substrate;
   a lead connected to the substrate;
   a first microelectronic component having first and second portions on the substrate;
   a second microelectronic component on the substrate; and
   a plurality of conductors interconnecting a first contact region and a second contact region, the first contact region being on the first component and the second contact region being on a selected one of the lead and the second microelectronic component, a first of the conductors having a first inductance and a second of the conductors having a second inductance, the second inductance being greater than the first inductance,
   wherein each of the conductors contacts a respective pair of first and second contact points, the first contact point being in the first contact region and the second contact point being in the second contact region, and a distance between the first and second contacts points that are contacted by the first of the conductors is substantially the same as a distance between the first and second contact points that are contacted by the second of the conductors.

2. The electronic assembly of claim 1, wherein the first of the conductors has a first length and the second of the conductors has a second length, the second length being greater than the first length.

3. The electronic assembly of claim 2, wherein the first of the conductors extends to a first height above the substrate and the second of the conductors extends to a second height above the substrate, the second height being greater than the first height.

4. The electronic assembly of claim 3, wherein the conductors are wires and each of the distances between the respective first and second contact points are measured along an upper surface of the substrate.

5. The electronic assembly of claim 4, wherein the plurality of conductors comprises a first group of conductors and a second group of conductors, the first group of conductors contacting the first portion of the microelectronic component with a first wire density and the second group of the conductors contacting the second portion of the microelectronic component with a second wire density, the first wire density being higher than the second wire density.

6. The electronic assembly of claim 5, wherein the first microelectronic component further comprises a third portion, the first portion and the third portion being on opposing sides of the second portion, and wherein the plurality of conductors further comprises a third group contacting the third portion of the microelectronic component with a third wire density, the third wire density being higher than the second wire density.

7. The electronic assembly of claim 2, wherein each of the plurality of conductors comprises first and second opposing ends, and wherein the first and the second of the conductors are arranged such that a distance between the first and second ends of the first of the conductors is substantially the same as a distance between the first and second ends of the second of the conductors.

8. A RF power amplifier, comprising:
   a substrate;
   a lead connected to the substrate;
   a first microelectronic component having first, second, and third portions on the substrate, the first and third portions being on opposing sides of the second portion;
   a second microelectronic component on the substrate; and a plurality of conductors interconnecting a first contact region and a second contact region, the first contact region being on the first microelectronic component and the second contact region being on a selected one of the lead or the second microelectronic component, wherein each of the conductors contacts a respective pair of first and second contact points, the first contact point being in the first contact region and the second contact point being in the second contact region, and a greater number of the first contact points are on the first and third portions of the first microelectronic component per unit length of the first microelectronic component than on the second portion of the microelectronic component, and a distance between the first and second contact points is substantially the same for each pair of first and second contact points.

9. The RF power amplifier of claim 8, wherein the plurality of conductors interconnect the first microelectronic component and the lead, and further comprising a second plurality of conductors interconnecting the first microelectronic component and the second microelectronic component.

10. The RF power amplifier of claim 8, wherein a first of the conductors has a first inductance and a second of the conductors has a second inductance, the second inductance being greater than the first inductance.

11. The RF power amplifier of claim 10, wherein the first of the conductors has a first length and the second of the conductors has a second length, the second length being greater than the first length.

12. The RF power amplifier of claim 11, wherein the first of the conductors extends to a first height above the substrate and the second of the conductors extends to a second height above the substrate, the second height being greater than the first height.

13. The RF power amplifier of claim 12, wherein the conductors are wires and when viewed from a direction that is substantially perpendicular to the substrate, the plurality of wires extend from the first microelectronic component substantially parallel to one another, and wherein each of the distances between the respective first and second contact points is measured along an upper surface of the substrate.

14. The RF power amplifier of claim 13, wherein first microelectronic component is a microelectronic die having a plurality of transistors formed thereon.

15. A RF power amplifier, comprising:
a package substrate;
a lead connected to the package substrate;
a microelectronic die on the package substrate, the microelectronic die having first, second, and third transistors formed on respective first, second, and third portions thereof, the first and third portions being on opposing sides of the second portion;
a microelectronic component on the substrate;
first and second contact regions, the first contact region being on the microelectronic die and the second contact region being on a selected one of the lead and the microelectronic component; and
a first plurality of conductors interconnecting the first and second contact regions, a first number of the first plurality of conductors contacting the first portion of the microelectronic die per unit length of the microelectronic die and the first plurality of conductors having a first average length;
a second plurality of conductors interconnecting the first and second contact portions, a second number of the second plurality of conductors contacting the second portion of the microelectronic die per unit length of the microelectronic die and the second plurality of conductors having a second average length; and
a third plurality of conductors interconnecting the first and second contact portions, a third number of the third plurality of conductors contacting the third portion of the microelectronic die per unit length of the microelectronic die and the third plurality of conductors having a third average length,
wherein the first number of the first plurality of conductors contacting the first portion of the microelectronic die per unit length of the microelectronic die and the second number of the second plurality of conductors contacting the second portion of the microelectronic die per unit length of the microelectronic die are greater than the third number of the third plurality of conductors contacting the third portion of the microelectronic die per unit length of the microelectronic die, and the first and third average lengths are less than the second average length, and
wherein each conductor of the first plurality of conductors, the second plurality of conductors, and the third plurality of conductors comprises first and second opposing ends and the first plurality of conductors, the second plurality of conductors, and the third plurality of conductors are arranged such that a distance between the first and seconds ends of each conductor of the first plurality of conductors, the second plurality of conductors, and the third plurality of conductors is substantially the same.

16. The RF power amplifier of claim 15, wherein the first plurality of conductors extend to a first average height above the microelectronic die, the second plurality of conductors extend to a second average height above the microelectronic die, and the third plurality of conductors extend to a third average height, the second average height being greater than the first and third average heights.

17. The RF power amplifier of claim 15, wherein the first plurality of conductors, the second plurality of conductors, and third plurality of conductors are wires and the distance between the first and seconds ends of each conductor of the first plurality of conductors, the second plurality of conductors, and the third plurality of conductors is measured along an upper surface of the package substrate.

18. The RF power amplifier of claim 17, further comprising a second lead connected to the package substrate, a second microelectronic component on the package substrate, and a fourth plurality of wires interconnecting the microelectronic die, the second microelectronic component, and the second lead.

19. The RF power amplifier of claim 18, wherein the microelectronic die, the microelectronic component, the second microelectronic component, the first plurality of wires, the second plurality of wires, the third plurality of wires, and the fourth plurality of wires jointly form a first set of microelectronic components, and further comprising a second set of microelectronic components substantially identical to the first microelectronic components.

20. The RF power amplifier of claim 15, wherein the selected one of the lead and the microelectronic component is the microelectronic component.

* * * * *